United States Patent [19]
Gosselin

[11] Patent Number: 5,733,639
[45] Date of Patent: Mar. 31, 1998

[54] CIRCUIT BOARD ASSEMBLY WITH FOAM SUBSTRATE AND METHOD OF MAKING SAME

[75] Inventor: Daniel T. Gosselin, Naperville, Ill.

[73] Assignee: Poly Circuits/M-Wave, Bensenville, Ill.

[21] Appl. No.: 684,136

[22] Filed: Jun. 28, 1996

Related U.S. Application Data

[60] Provisional application No. 60/000,727 Jun. 30, 1995, now abandoned.

[51] Int. Cl.⁶ .................. B32B 3/00; B32B 27/00; B32B 5/14; B32B 7/12
[52] U.S. Cl. .................. 428/209; 428/422.8; 428/308.4; 428/344; 428/334; 428/304.4; 428/317.3; 428/425.1; 428/901; 174/256
[58] Field of Search ............... 428/317.7, 422.8, 428/319.1, 319.3, 319.7, 334, 425.1, 209, 304.4, 317.3, 344

[56] References Cited

U.S. PATENT DOCUMENTS

| | | | |
|---|---|---|---|
| 3,768,048 | 10/1973 | Jones, Jr. et al. | 333/84 |
| 4,360,562 | 11/1982 | Endo et al. | 428/317 |
| 4,496,627 | 1/1985 | Azuma et al. | 428/336 |
| 4,576,971 | 3/1986 | Baumgartner et al. | 521/108 |
| 4,699,841 | 10/1987 | Kundinger et al. | 428/332 |
| 4,751,136 | 6/1988 | Kamiya et al. | 428/317 |
| 4,769,270 | 9/1988 | Nagamatsu et al. | 428/131 |
| 4,857,381 | 8/1989 | Suzuki | 428/120 |
| 4,886,700 | 12/1989 | Younes | 428/252 |
| 4,931,354 | 6/1990 | Wakino et al. | 428/209 |
| 4,937,132 | 6/1990 | Gaku et al. | 428/209 |
| 5,149,590 | 9/1992 | Arthur et al. | 428/421 |
| 5,288,542 | 2/1994 | Cibulsky et al. | 428/209 |
| 5,393,591 | 2/1995 | Fasbender et al. | 428/209 |

FOREIGN PATENT DOCUMENTS

WO93/2431  12/1993  WIPO .................. B32B 3/00

*Primary Examiner*—Patrick Ryan
*Assistant Examiner*—Cathy F. Cam
*Attorney, Agent, or Firm*—Leydig, Voit & Mayer, Ltd.

[57] ABSTRACT

A laminated circuit board comprising a high frequency, low dielectric, and low dissipation factor foam substrate layer and at least one metal cladding layer laminated to the foam substrate layer. The foam substrate layer is formed of a closed-cell polyisocyanurate rigid foam having a closed-cell structure greater than 95%.

9 Claims, 1 Drawing Sheet

CIRCUIT BOARD ASSEMBLY WITH FOAM SUBSTRATE AND METHOD OF MAKING SAME

RELATED APPLICATIONS

This application claims the benefit of U.S. Provisional Application No. 60/000,727 now abandoned, filed Jun. 30, 1995.

FIELD OF THE INVENTION

The present invention relates generally to a substrate for electrical circuits, and more particularly to a circuit board assembly for use in combination with high frequency circuit.

BACKGROUND OF THE INVENTION

Printed circuit boards having low dielectric constants and low dissipation factors are preferred for use with high frequency circuits. Laminates having these properties may effectively be used for these printed circuit boards. Such laminates often include foam materials as the substrate providing the desirable dielectric and dissipation properties and also include metalization layers. The following U.S. patents include some teaching of foam-substrate laminates for use in high frequency applications: U.S. Pat. Nos. 3,768,048; 4,360,562; 4,751,136; and 4,886,700. These patents teach use of such laminates either as microwave components or as circuit boards for microwave circuitry. In addition to having the desirable dielectric and dissipation properties, however, the laminates should also be suitable to conventional circuit board processing. For example, it is desirable to include plated through holes in such a structure.

The substrate foams in the above-cited patents either are not capable of being processed according to conventional circuit board processing techniques or do not have the required electrical properties. In the former case, the structure or chemical nature of the foam is such that the chemicals, used for such operations as etching and plating circuit boards, will penetrate into unwanted areas of the foam substrate. This may not only affect the dielectric and dissipation properties of the substrate, but may also affect it structurally.

SUMMARY OF THE INVENTION

Accordingly, it is a primary aim of the invention to provide a high frequency, low dielectric constant and low dissipation factor substrate adaptable to circuit board processing chemistries for printed circuit board applications.

In accordance with that aim, it is a primary object of the invention to provide a laminate including a foam substrate and a metal cladding layer or layers that can be processed according to conventional circuit board processing techniques.

It is a related object to provide a laminate of this structure which may allow for formation of plated through holes for use as a printed circuit board.

It is a related object to provide a laminate including a foam substrate capable of being processed as a single sided, double sided, or multi-layer circuit board having plated through holes to provide continuous conductivity between layers.

It is a further object of the invention to provide a laminate including a foam substrate and metal cladding layer or layers wherein the cladding layer has sufficient smoothness for accurate processing by conventional circuit board processing techniques.

Another object of the invention is to provide a laminate including a foam substrate and a metal cladding layer or layers wherein the means for joining the laminate layers does not adversely affect the dielectric or dissipation properties of the substrate.

It is a related object to provide such a laminate that includes a structure that enhances the flatness of the metal cladding layer without adversely affecting the dielectric or dissipation properties of the foam substrate.

In accordance with these and other objects of the invention, there is provided a high frequency, low dielectric and low dissipation factor substrate for formation into a laminate to be used as a printed circuit board. The laminate includes the foam substrate as well as at least one metal cladding layer disposed on the substrate. The substrate is formed of a closed-cell polyisocyanurate rigid foam, with the closed-cell structure being greater than 95%. Use of this foam having that closed-cell structure insures that the wet chemistries involved in plating and etching operations for the printed circuit board will not adversely affect the foam substrate. Accordingly, plated through-holes and other conventional circuit board processing techniques can be applied to the resulting laminate.

According to a preferred embodiment of the invention, the adhesive used for joining the substrate and metal cladding layer further incorporates micro-balloons. The purpose of the micro-balloons is to fill the cavities in the cut surface cells of the closed-cell dielectric foam substrate to thereby provide a backpressure against the metal foil during the lamination procedure. Thus, instead of the reduced support that would be offered by cut surfaced cells, the micro-balloons provide adequate support. In this way, the micro-balloons simulate a closed cell structure at the surface of the foam by holding air as would a closed-cell in the foam. Further, the use of balloons filled with air as opposed to a solid filler material insures that the presence of the micro-balloons has less influence on the dielectric properties of the substrate than would a solid filler material.

The materials and processes according to the present invention lend themselves to cost effective production of a high volume of printed circuit boards with desirable electrical and mechanical properties.

BRIEF DESCRIPTION OF THE PREFERRED EMBODIMENTS

While the invention will be described in connection with certain preferred embodiments, there is no intent to limit it to those embodiments. On the contrary, the intent is to cover all alternatives, modifications and equivalents included within the spirit and scope of the invention as defined by any appended claims.

The laminate according to the present invention has both advantageous electrical properties (low dielectric constant and dissipation factor) as well as an ability to be processed according to conventional circuit board processing techniques. Accordingly, it is well suited to use as a circuit board for high frequency circuits.

To provide both the necessary electrical properties and the necessary resistance to the wet chemistries typically employed in processing circuit boards, the laminate according to the invention includes a substrate formed of a rigid closed cell polyisocyanurate foam, having a closed cell structure greater than on the order of 95%. In addition to inhibiting the conventional etching and plating solutions from permeating into the foam, the closed cell structure of the foam also allows the foam to be machined or drilled either with or without the metal cladding layers to be described in greater detail below. Furthermore, the resulting foam has a dielectric constant below 1.5, and a dissipation factor at or below 0.0025.

The foam substrate material is manufactured commercially, and is readily available in various densities, and in specified thicknesses. It has been determined that lower densities are desired, since both dielectric constant and dissipation decrease with density. For use as a substrate for a printed circuit board according to the invention, I have determined that the ideal density of the foam is 10 lbs/ft$^3$ or lower. The thickness of the foam substrate is preferably several multiples of the thickness of the adhesive by which the metal bonding layer is joined to the substrate. This ensures that the adhesive layer has a minimal effect on the electrical properties of the foam substrate.

Figure 1:
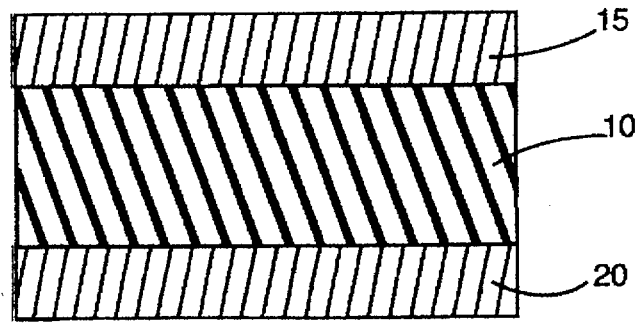
FIG. 1 is an enlarged sectional view of a laminate according to a preferred embodiment of the invention.

A laminate according to the invention and including the foam substrate just described is shown in FIG. 1. While the invention may be embodied either in a single-sided, double-sided or multi-layer circuit board, a double-sided embodiment is shown in FIG. 1, as including the foam substrate 10, and metal cladding layers 15 and 20. The metal cladding layers may be formed of a variety of conductive metals, but are preferably formed of a 1 oz./ft$^2$ (or lighter) electrodeposited copper foil. The metal foil and/or metal plate used for circuitry or ground plane is dependent on the application and performance required from the design. As will be discussed in greater detail below, an adhesive layer is disposed between the substrate and the metal cladding layer or layers to form the laminate.

Figure 2:
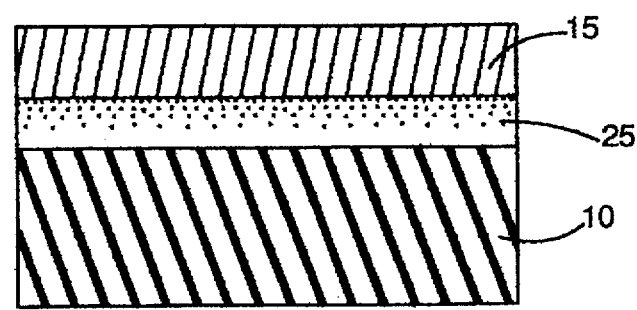
FIG. 2 is a magnified view of the foam substrate, adhesive layer and metal cladding layer of the laminate according to the invention.

The magnified view of FIG. 2 shows the foam substrate 10, one of the metal cladding layers 15, and the adhesive layer 25. The preferred adhesive is a high glass transition ($T_g$=170/C.) epoxy resin. This type of adhesive is not only low in cost, but is also capable of withstanding the temperatures associated with soldering and de-soldering of the laminate during circuit board fabrication. I have found that a 1 mil thickness adhesive layer is sufficient for bonding a 0.080" thick foam substrate to a metal cladding layer, while having very little influence on the electrical properties of the substrate. Other thermosets, thermoplastic and pressure sensitive adhesives also may provide sufficient bonds between the foam substrate and the metal cladding layer, but selection must be made in accordance with the application and the need for subsequent processing of the circuit board. There tends to be a greater control on the deposition of the adhesive by applying it to the matte or bond side of the metal foil rather than directly on the foam. Coating of the foil is preferably achieved by either spray coating the adhesive, or by applying the adhesive as a laminate from a transfer roll. Further, a precoated copper foil with a 1 mil coating of a B-staged resin will also provide a sufficient bond to the substrate.

Following application of the adhesive and metal cladding layer to the substrate, the resulting stack must then be laminated. Preferably, such lamination is performed in a hydraulic press. Vacuum bagging and curing in an oven, hydraulic vacuum pressing, and autoclave lamination are also successful techniques for attaining sufficient bonds. Because of the nature of the closed cell foam, there is no impregnation of the resin or other adhesive into the substrate. Thus, only intimate contact between the foil, adhesive and foam is required for sufficient bonds. Lamination may thus be achieved in a low pressure environment using an appropriate adhesive.

Figure 3:
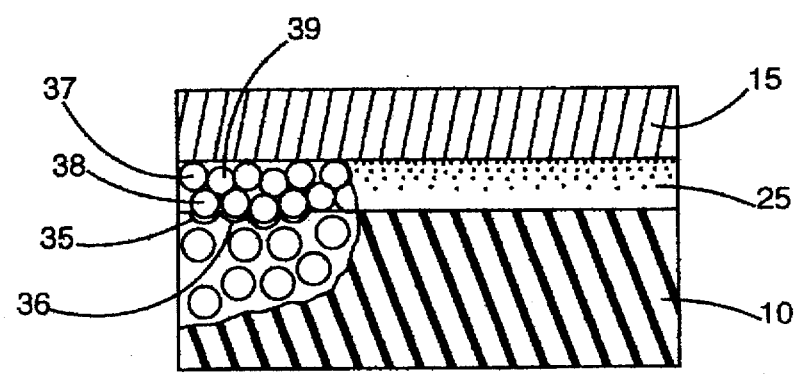
FIG. 3 is a further magnified view showing the closed cell structure of the foam, the adhesive layer including micro-balloons and the metal cladding layer according to a further embodiment of the invention.

To enhance the smoothness of the metal foil layers, and to assure adequate bonding of the metal clad layer to the substrate, micro-balloons may be incorporated into the adhesive layer during its uncured state. The function of these micro-balloons is to fill the cavities in the cut surface cells in the closed-cell dielectric foam forming the substrate. The micro-balloons in place within these cavities thus provide a back pressure against the metal foil to the caul during the lamination process. A magnified section view of the resulting structure is shown in FIG. 3. Cutting of the substrate 10 to form a flat surface will result in the formation of open surface cells in the foam, such as are indicated by reference numbers 35 and 36. Micro-balloons 37, 38, and 39 in the resin 25 may then fill these open surface cells (see 38, 39) or may otherwise be disposed in the resin layer (see 37), thereby providing support to the interior side of the cladding layer, and preventing it from contouring to the surface cavities of the cut foam. While only a single micro-balloon has been shown in a given open-cell cavity, the size variation of the micro-balloons and cavities could result in several micro-balloons in a given cavity. I have found that the addition to the adhesive of 10% to 30% by weight of 120 to 130 micron diameter (average of particle size distribution) micro-balloons is sufficient to give a good bond and avoid the potential risk of an "orange peel" appearance to the cladding layer. The viscosity of the adhesive may need to be modified to allow the micro-balloons to be added while maintaining the necessary fluid properties in the adhesive. The micro-balloons also simulate a closed-cell structure at the top layer of the foam since they hold air as would a true closed cell in the foam. As a result, the micro-balloons advantageously have less influence on the electrical properties of the substrate than would a solid filler material serving the same function.

Figure 4:
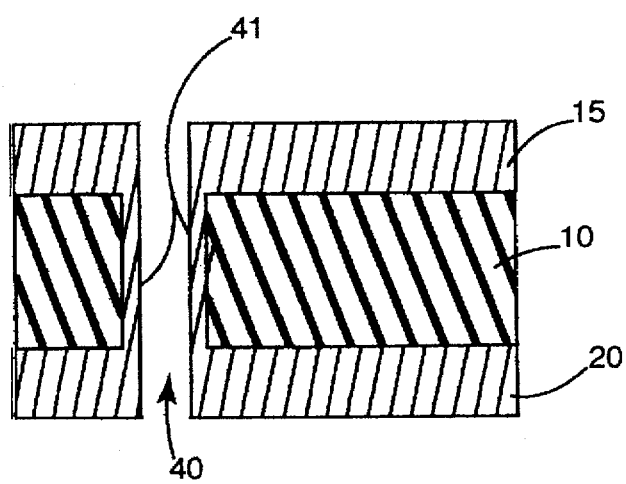
FIG. 4 is a magnified view of a laminate according to the invention and including a plated through hole.

Following formation of a laminate according to the invention as described above, conventional circuit board processing techniques may be used on the sample. For example, plated through holes may be formed in such a laminate. FIG. 4. shows a laminate including such a through hole 40, including plating 11. The following conventional steps were performed on a 0.250" thick polyisocyanurate panel clad with 1 oz electro-deposited foil using a high glass transition epoxy resin. First, several holes were drilled into the foam substrate perpendicularly so as to penetrate the foil on both sides. The holes were spaced 0.040" apart, and had a variety of diameters. The panel was then processed in the following functional solutions, as indicated:

sensitizer at 115/F. for 10 minutes triple water rinse at 60/F. for 2 minutes each preactivator at room temperature for 1.5 minutes activator at 115/F. for 10 minutes double water rinse for 2 minutes each converter at 5/F. for 1.5 minutes double water rinse for 2 minutes each enhancer at room temperature for 1 minute stabilizer at room temperature for 45 seconds water rinse dip in 5% sulfuric acid for 5 to 10 seconds microetch dip at 80/F. for 1 minute dip in 5% sulfuric acid for 5 to 10 seconds Finally, the foam substrate was run in an acid copper plating bath in a Hull cell at 10 amps/ft$^2$ current density. Higher current densities could be used to speed the process. The results of this process were excellent copper coverage on the surface of the through hole walls, and conductivity through the foam core. No short circuits were present since the closed cell structure of the foam prevented any leaching of the chemicals into the interior. An unclad sample of foam was also subjected to the above process, and accepted plating over the entire surface with no leaching of solution into the interior closed cells.

The above example establishes that clad metal through holes may be reliably formed in the laminate according to the invention. Full processing of the laminate for intended circuit applications would require the sample to be first drilled or machined to the required physical specifications. The laminate is then laminated with a dry film or silk screened for applying an etch resistant film. The advantageous mechanical properties of the polyisocyanurate foam may provide sufficient strength for dry film roll lamination. The film is then exposed as either a positive or negative image and developed. The panel is then subjected to the functional solutions listed above. Further processing operations may include: solder plating, immersion tin, gold plating and the like. The etch resist is then removed, and the unwanted copper is then removed by etching in either an ammoniacle base, ammonium persulphate, or like etchant solution. The resulting board can then be populated by soldering and de-soldering active and passive components. Further processing will allow boards with different circuit designs and different dielectric substances to be stacked, aligned, and bonded together with non-conductive, conductive, thermoset, and/or pressure sensitive adhesives to form a multi-layer board.

Accordingly, there has been provided a low dielectric constant, low dissipation laminate for use as a printed circuit board and method of making same. The laminate includes a foam substrate having on the order of a 95% closed cell structure. One or more metal cladding layers may be joined to the substrate with an adhesive that may or may not include micro-balloons for supporting purposes. The closed cell structure of the foam renders it impervious to the wet chemistries of standard circuit board processing. Accordingly, standard circuit board processing techniques, such as creation of plated through holes, may be performed on the laminate of the invention.

What is claimed is:

1. A laminated circuit board comprising:
   a foam substrate layer of closed-cell polyisocyanurate rigid foam having a closed-cell structure greater than 95%; and
   at least one metal cladding layer laminated to the substrate layer.

2. A laminated circuit board as in claim 1, wherein the circuit board includes two metal cladding layers laminated to opposite sides of the foam substrate layer.

3. A laminated circuit board as in claim 2, wherein the circuit board has plated through holes penetrating the foam substrate layer for electrically connecting the two metal cladding layers.

4. A laminated circuit board as in claim 1, further including an adhesive layer disposed between the foam substrate layer and the metal cladding layer for bonding the metal cladding layer to the foam substrate layer.

5. A laminated circuit board as in claim 4, wherein the adhesive layer includes micro-balloons for filling surface cavities on the substrate layer, thereby enhancing surface smoothness of the metal cladding layer when bonded onto the foam substrate layer.

6. A laminated circuit board as in claim 5, wherein the adhesive layer has a micro-balloon concentration of about 10% to 30% by weights, and wherein the micro-balloons have an average diameter of about 120 microns to 130 microns.

7. A laminated circuit board as in claim 4, wherein the adhesive layer comprises high glass transition epoxy resin.

8. A laminated circuit board as in claim 1, wherein the foam substrate layer has a dielectric constant below 1.5 and a dissipation factor no greater than 0.0025.

9. A laminated circuit board as in claim 1, wherein the foam substrate layer has a density no greater than about 10 lb/ft3.

\* \* \* \* \*